(12) United States Patent
Wu et al.

(10) Patent No.: US 9,543,297 B1
(45) Date of Patent: Jan. 10, 2017

(54) FIN-FET REPLACEMENT METAL GATE STRUCTURE AND METHOD OF MANUFACTURING THE SAME

(71) Applicant: GLOBALFOUNDRIES Inc., Grand Cayman, KY (US)

(72) Inventors: Xusheng Wu, Ballston Lake, NY (US); Konstantin G. Korablev, Saratoga Springs, NY (US); Shesh Mani Pandey, Clifton Park, NY (US); Manfred Eller, Beacon, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/869,397

(22) Filed: Sep. 29, 2015

(51) Int. Cl.
*H01L 21/82* (2006.01)
*H01L 27/088* (2006.01)
*H01L 21/8234* (2006.01)
*H01L 29/10* (2006.01)
*H01L 21/02* (2006.01)
*H01L 21/3105* (2006.01)
*H01L 21/311* (2006.01)
*H01L 29/66* (2006.01)

(52) U.S. Cl.
CPC ..... *H01L 27/0886* (2013.01); *H01L 21/02282* (2013.01); *H01L 21/31055* (2013.01); *H01L 21/31133* (2013.01); *H01L 21/823431* (2013.01); *H01L 21/823437* (2013.01); *H01L 29/1083* (2013.01); *H01L 29/66545* (2013.01)

(58) Field of Classification Search
CPC ............. H01L 27/0886; H01L 21/823431; H01L 29/66795; H01L 29/66818; H01L 29/785
See application file for complete search history.

(56) References Cited

U.S. PATENT DOCUMENTS

| 7,034,361 | B1* | 4/2006 | Yu | H01L 29/4908 257/349 |
| 2010/0264497 | A1* | 10/2010 | Chang | H01L 29/7856 257/393 |
| 2013/0005103 | A1* | 1/2013 | Liu | H01L 21/3065 438/285 |
| 2013/0249019 | A1* | 9/2013 | Kelly | H01L 29/7845 257/402 |

* cited by examiner

*Primary Examiner* — Mark Prenty
(74) *Attorney, Agent, or Firm* — Ditthavong & Steiner, P.C.

(57) ABSTRACT

A method of forming fins and the resulting fin-shaped field effect transistors (finFET) are provided. Embodiments include forming silicon (Si) fins over a substrate; forming a first metal over each of the Si fins; forming an isolation material over the first metal; removing an upper portion of the isolation material to expose and upper portion of the first metal; removing the upper portion of the first metal to expose an upper portion of each Si fin; removing the isolation material after removing the upper portion of the first metal; and forming a second metal over the first metal and the upper portion of the Si fins.

11 Claims, 8 Drawing Sheets

FIN-FET REPLACEMENT METAL GATE STRUCTURE AND METHOD OF MANUFACTURING THE SAME

TECHNICAL FIELD

The present disclosure relates to the manufacture of semiconductor devices including fin-shaped field effect transistors (finFETs). In particular, the present disclosure relates to forming a metal gate over a fin used in manufacturing a semiconductor device in the 14 nanometer (nm) technology node and beyond.

BACKGROUND

A finFET includes a source-channel-drain region (the fin) around which is formed a gate. Activation of the gate, source and drain facilitates current drivability in the channel between the source and the drain, thereby facilitating operation of the finFET.

In finFET technologies at 14 nm node and beyond, the structure of the fin is critical for device performance. Narrow fin width in the range of 5 to 10 nm is a key requirement/feature which benefits the control of the short-channel effect (SCE) and enhancement of transistor performance. With conventional techniques, however, a trapezoid-shaped fin results due to fin etch processing. For example, a conventional fin having a height of 30 nm will have a top portion of 5 to 7 nm in width and a bottom portion of 14 to 16 nm thick. Thus, the bottom portion of the fin is always thicker than a top portion of the fin and results in a fin body control delta between the top and bottom portions. A punch-through-stop (PTS) implant is commonly used for control the fin bottom SCE.

Replacement metal gate (RMG) processing is commonly used in finFET technology. Uniform metal material with RMG processing is a key requirement for reliable device characteristics. However, considering the trapezoid-shaped fin and non-uniform doping, in order to optimize device design, the RMG gate design also needs to be adjusted/controlled to ensure reliable device characteristics.

A need therefore exists for methodology that adjusts/controls RMG design taking into consideration trapezoid-shaped fins, and improves the performance of resulting devices.

SUMMARY

An aspect of the present disclosure includes a methodology for providing a finFET RMG structure including two WF metals on one fin. The top portion of the fin is low-doped for high mobility with a high WF metal. The bottom portion of the fin has PTS for leakage control and SCE, but includes a low WF metal for better driving capability, while providing improved device performance.

Another aspect includes providing a RMG structure that can be used as a multi-voltage ($V_t$) scheme. By providing different WFs, multi-$V_t$ devices can be more easily integrated.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming silicon (Si) fins over a substrate; forming a first metal over each of the Si fins; forming an isolation material over the first metal; removing an upper portion of the isolation material to expose and upper portion of the first metal; removing the upper portion of the first metal to expose an upper portion of each Si fin; removing the isolation material after removing the upper portion of the first metal; and forming a second metal over the first metal and the upper portion of the Si fins.

Aspects include forming a dielectric layer over each of the Si fins prior to forming the first metal. Other aspects include the dielectric layer including a high-k dielectric. Still further aspects include the second metal being formed over the dielectric layer adjacent to an upper portion of each Si fin. Additional aspects include forming a metal cap layer over the first metal layer prior to forming the isolation material. Other aspects include spin coating the isolation material over the first metal, wherein the isolation material includes an organic planarization layer (OPL). Further aspects include planarizing the isolation material with chemical mechanical polishing (CMP) prior to removing the upper portion of the isolation material. Yet other aspects include removing the isolation material with wet etching. Another aspect includes the first metal being a punch through stop layer. Additional aspects include the first and second metals having different work functions. Other aspects include the first metal having a lower work function than the second metal.

Another aspect of the present disclosure is a device including: Si fins formed over a substrate; a dielectric layer formed over each of the Si fins; a first metal over the dielectric layer adjacent to a lower portion of each of the Si fins; and a second metal formed over the first metal and over the dielectric layer adjacent to an upper portion of each of the Si fins.

Aspects include the dielectric layer including a high-k dielectric material. Other aspects include the first and second metals including different metals. Still further aspects include the first metal being a punch through stop layer. Additional aspects include a metal cap layer formed between the first and second metal layers adjacent to a lower portion of each of the Si fins. Other aspects include the first metal having a different work function than the second metal. Further aspects include the first metal having a lower work function than the second metal.

Another aspect of the present disclosure is a method including: forming Si fins over a substrate; forming a high-k dielectric layer over each of the Si fins; forming a first metal over the high-k dielectric layer; forming an OPL over the first metal; removing an upper portion of the OPL to expose and upper portion of the first metal; removing the upper portion of the first metal to expose an upper portion of each of the Si fins; removing the isolation material after removing the upper portion of the first metal; forming a second metal over the first metal and over the high-k dielectric layer adjacent to the upper portion of each of the Si fins, the second metal having a higher work function than the first metal; and forming a metal gate over the first and second metals. Aspects include forming a metal cap layer between the first and second metals.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about".

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
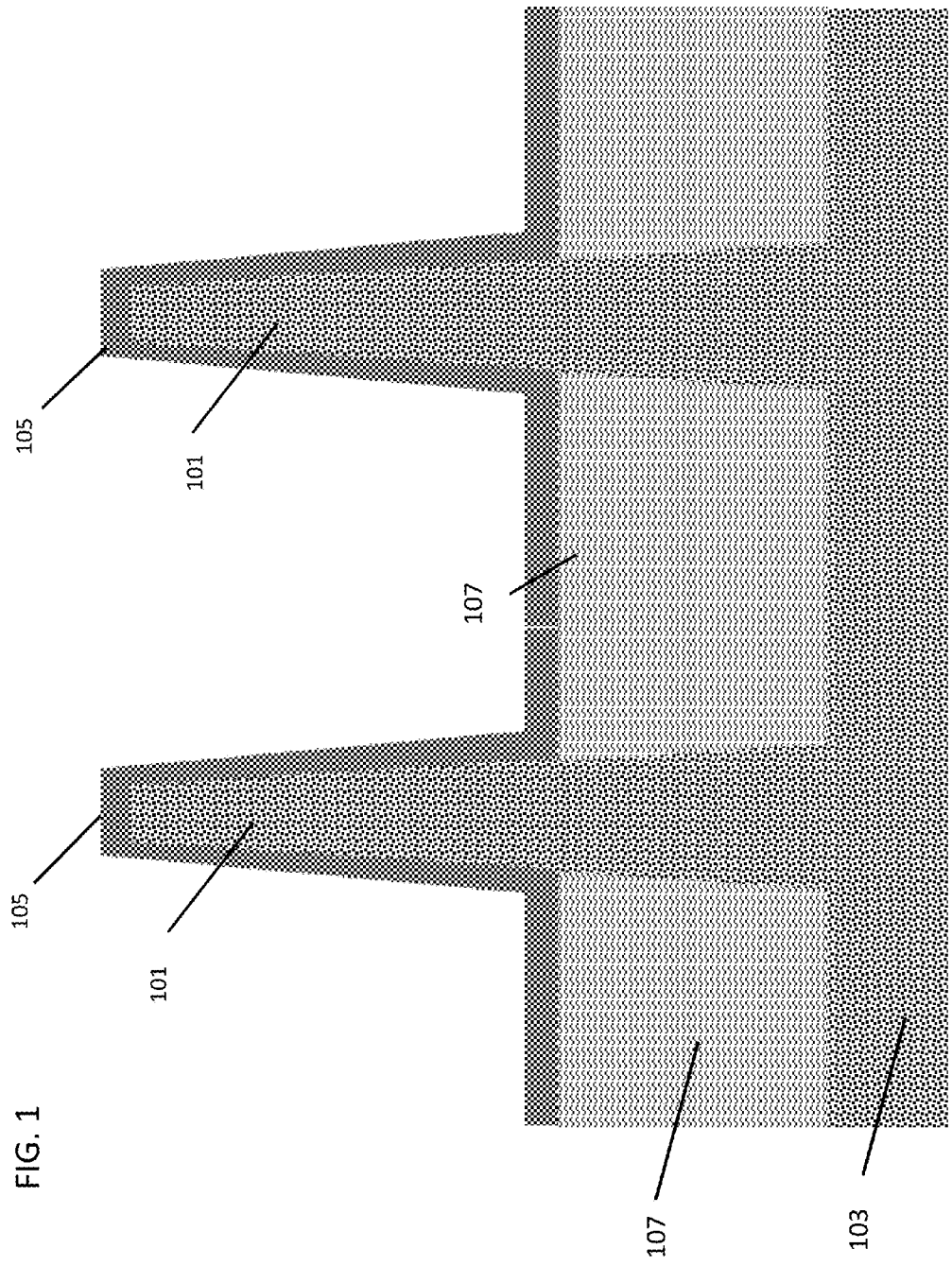
FIGS. 1 through 8 illustrate, in cross sectional view, a process flow to produce a finFET RMG structure, in accordance with an exemplary embodiment.

Adverting to FIG. 1, fins 101 are formed over substrate 103. Substrate 103 includes a Si substrate. Other examples of materials that may be suitable for use in the substrate 103 include silicon-on-insulator (SOI), silicon germanium (SiGe), germanium (Ge), and/or compound semiconductor materials. Processes, such as photolithography and etch processes, can be used to create the fins 101. The fins 101 may include silicon. Fins 101 include a dielectric layer 105 deposited over the surface of the fins 101 and substrate 103. The dielectric layer 105 is a high-k dielectric material. In FIG. 1 shallow trench isolation (STI) regions 107 are formed in the substrate 103 between the fins 101. The STI is formed by etching a pattern of trenches in the substrate 103, depositing one or more dielectric materials (such as silicon dioxide) to fill the trenches, and removing the excess dielectric.

Prior to the deposition of the dielectric layer 105, the substrate undergoes a conventional processing for a bulk finFET. For example, shallow trench isolation (STI) regions and fins are formed by multi-layer hard mask deposition, STI/fin hard mask patterning, etching, photoresist stripping, Si-etching, oxide gap-fill, CMP, annealing, and hard mask removal. A thin oxide is grown to 1 nm over the fins 101. Next, $n^+/p^+$ well patterning; $n^+/p^+$ implanting; and annealing are performed. The gate stack is then formed by polysilicon deposition and patterning; spacer formation; and halo implants (selective for $n^+/p^+$ core, static random-access memory (SRAM), and input/output (I/O) areas). Epitaxially grown SiGe (for p-type source/drain) with in-situ or $p^+$ implant doping, and Si-epitaxy (for n-type raised source/drain) with in-situ $n^+$ implant doping are performed. Next, replacement metal gate (RMG) formation is performed. An interlayer dielectric (ILD) is deposited followed by polysilicon open CMP; and polysilicon removal. The dielectric layer 105 is then deposited over the fins 101.

Figure 2:
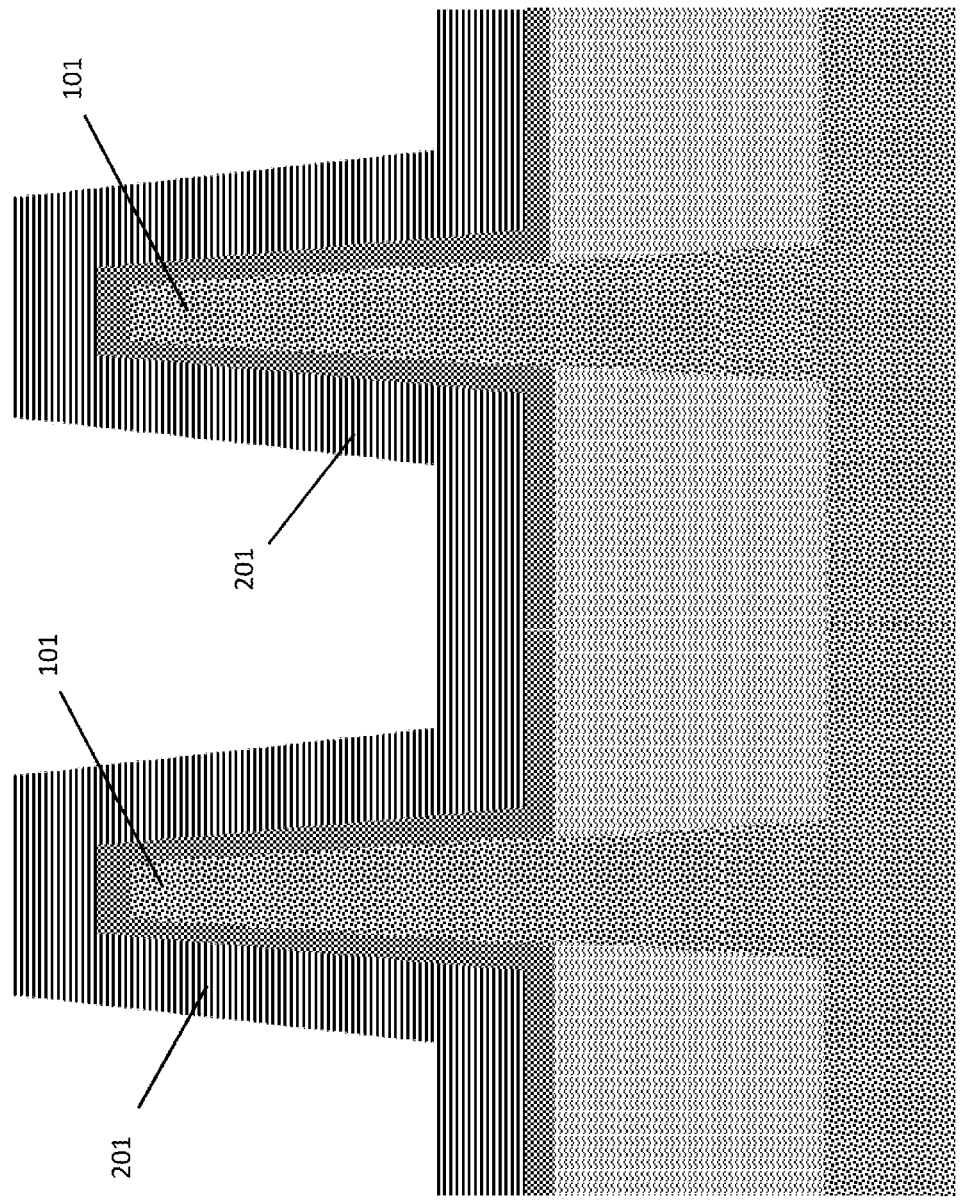

In the example of FIG. 2, the fins 101 have a first 201 metal deposited thereon. The first metal 201 can include metal compounds such as Mo, Cu, W, Ti, Ta, TiN, TaN, NiSi, CoSi, and/or other suitable conductive materials. The first metal 201 is deposited to a thickness of 0.1 to 10 nm.

Figure 3:
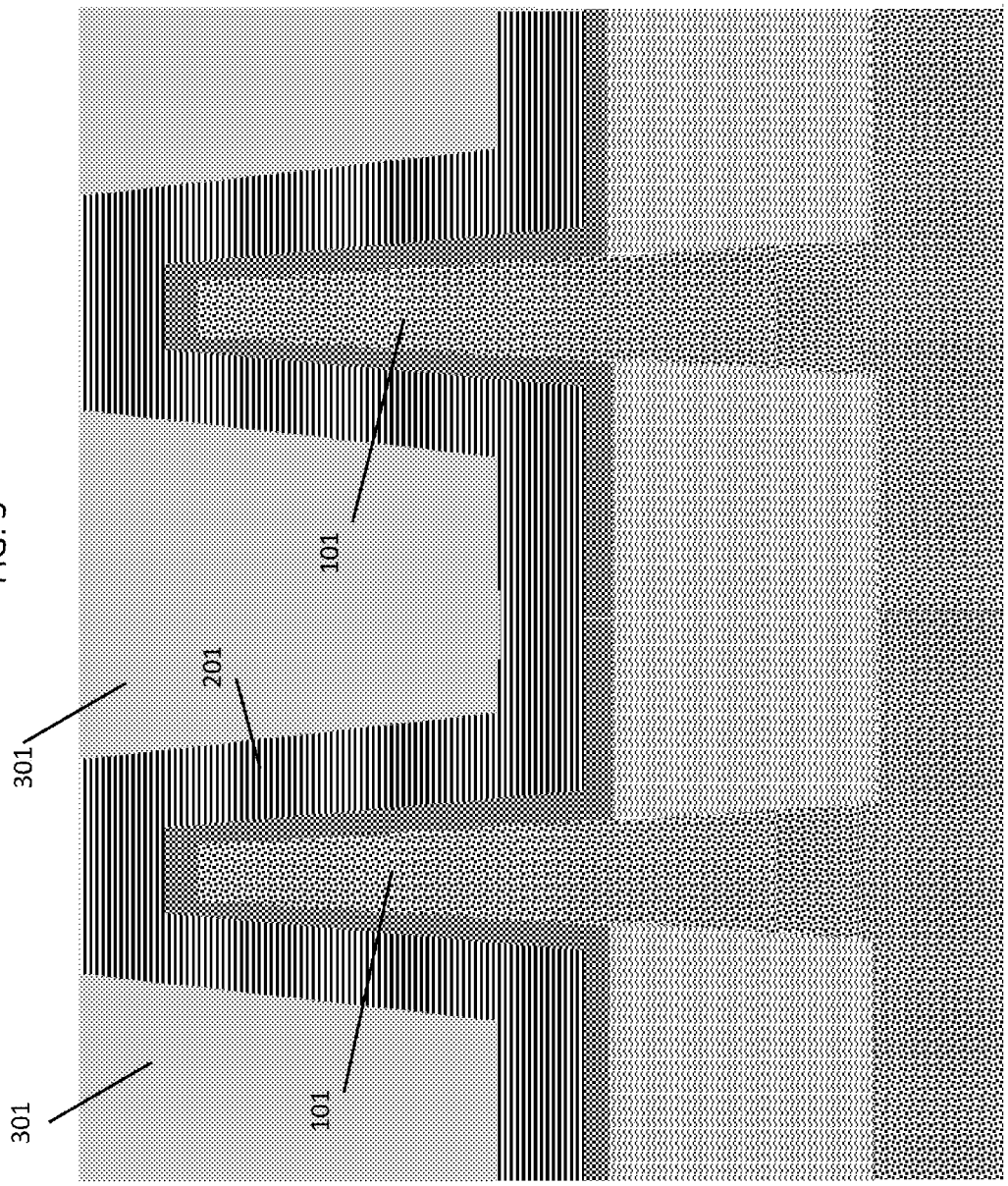

Adverting to FIG. 3, an isolation material 301 is deposited over and between the fins and subjected to CMP to planarize the upper surface of the isolation material 301 down to an upper surface of the first metal 201. The isolation material 301 can include an OPL. The isolation material 301 can be spin coated over the first metal 201.

Figure 4:
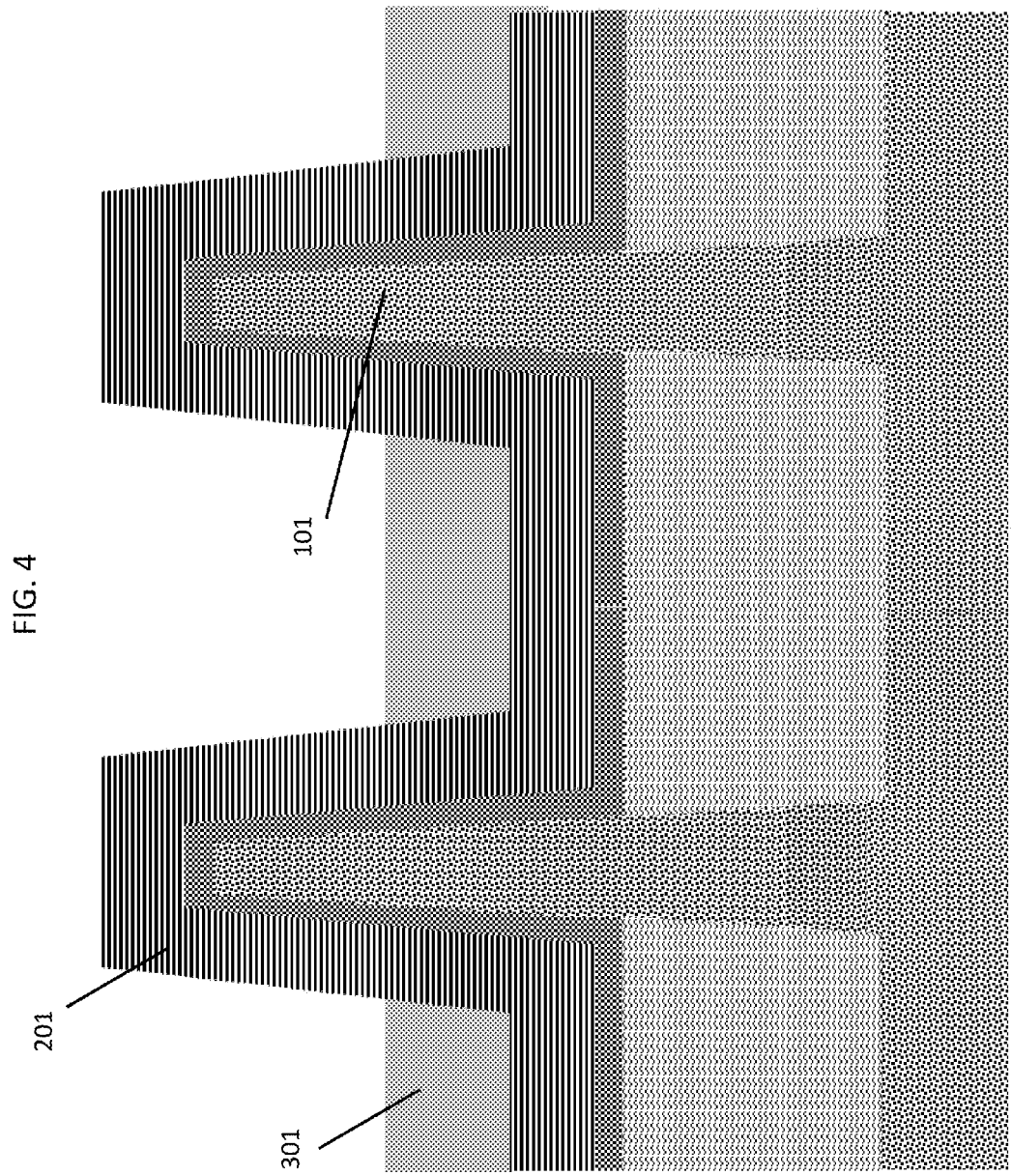

Adverting to FIG. 4, the isolation material 301 is recessed to expose an upper region of the first metal 201 and fins 101. Upper regions of each the first metal 201, fins 101 and the dielectric layer 105 are exposed following the recessing of isolation material 301.

Figure 5:
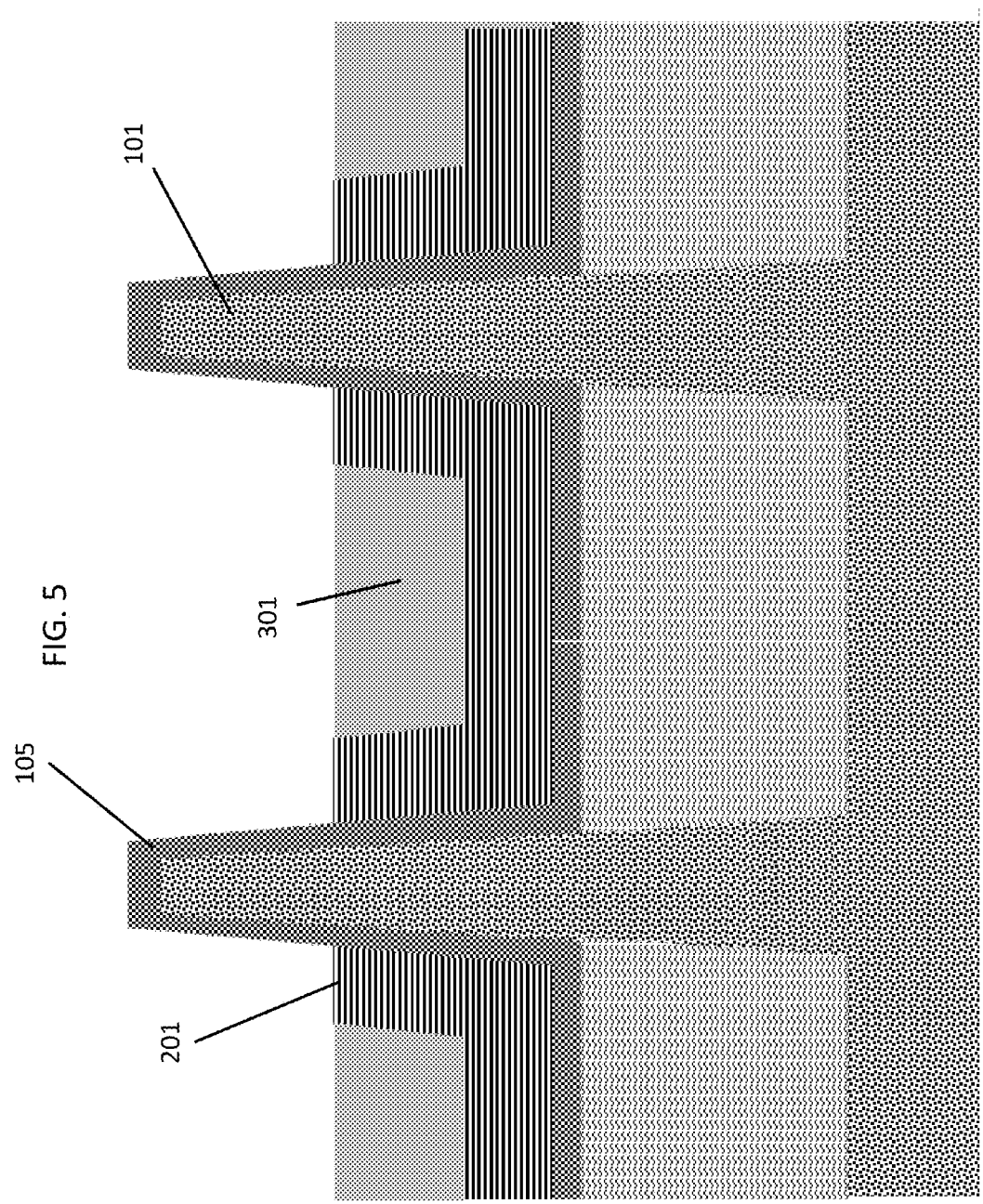
Figure 6:
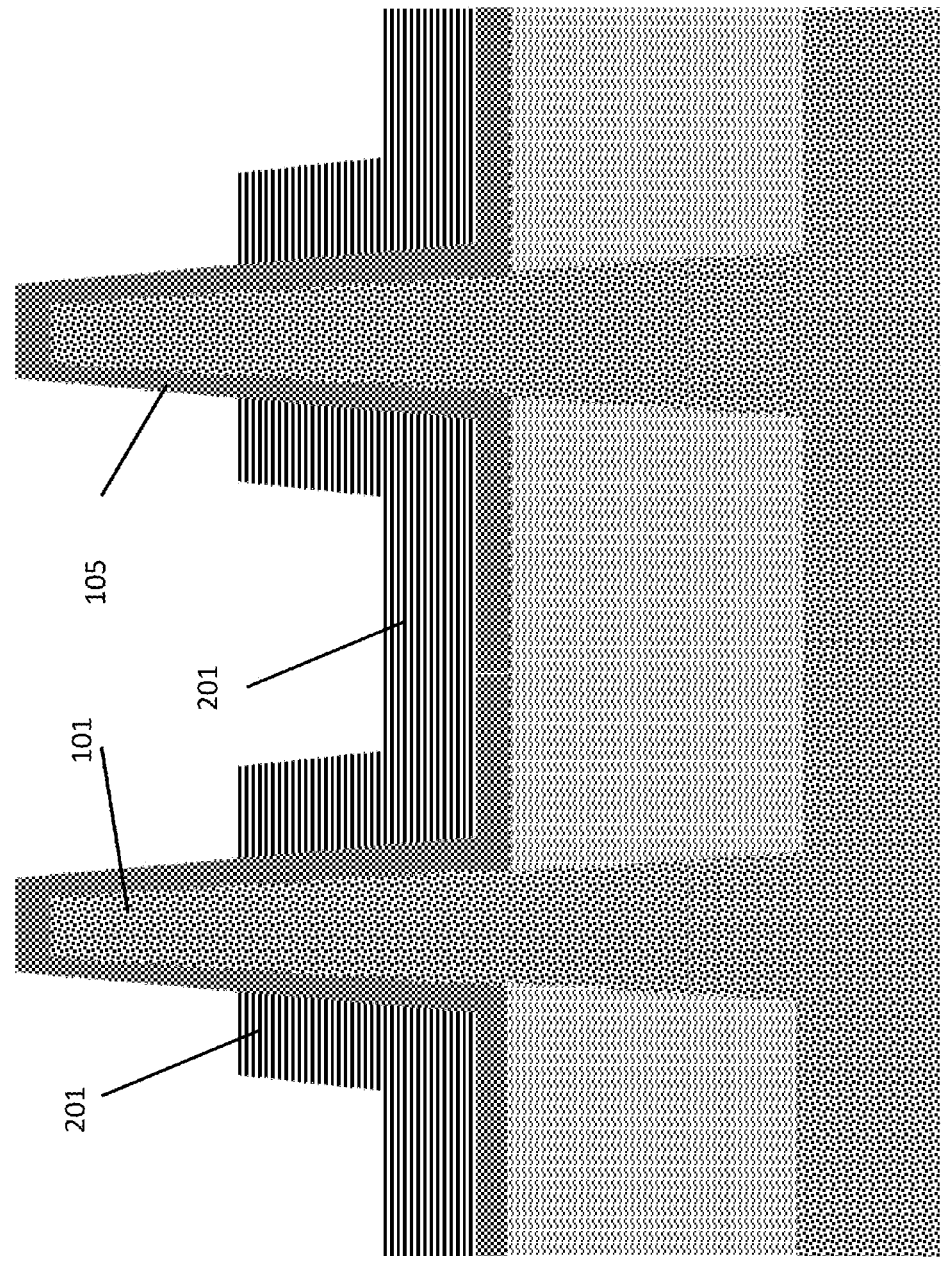

Turning to FIG. 5, the first metal 201 is etched down to the isolation material 301. Following the etching of the first metal 201, the upper portion of each of the fins 101 and dielectric layer 105 are exposed. Adverting to FIG. 6, the remaining portion of the isolation material 301 is removed to expose a lower portion of the first metal 201. The isolation material 301 can be removed by wet etching.

Figure 7:
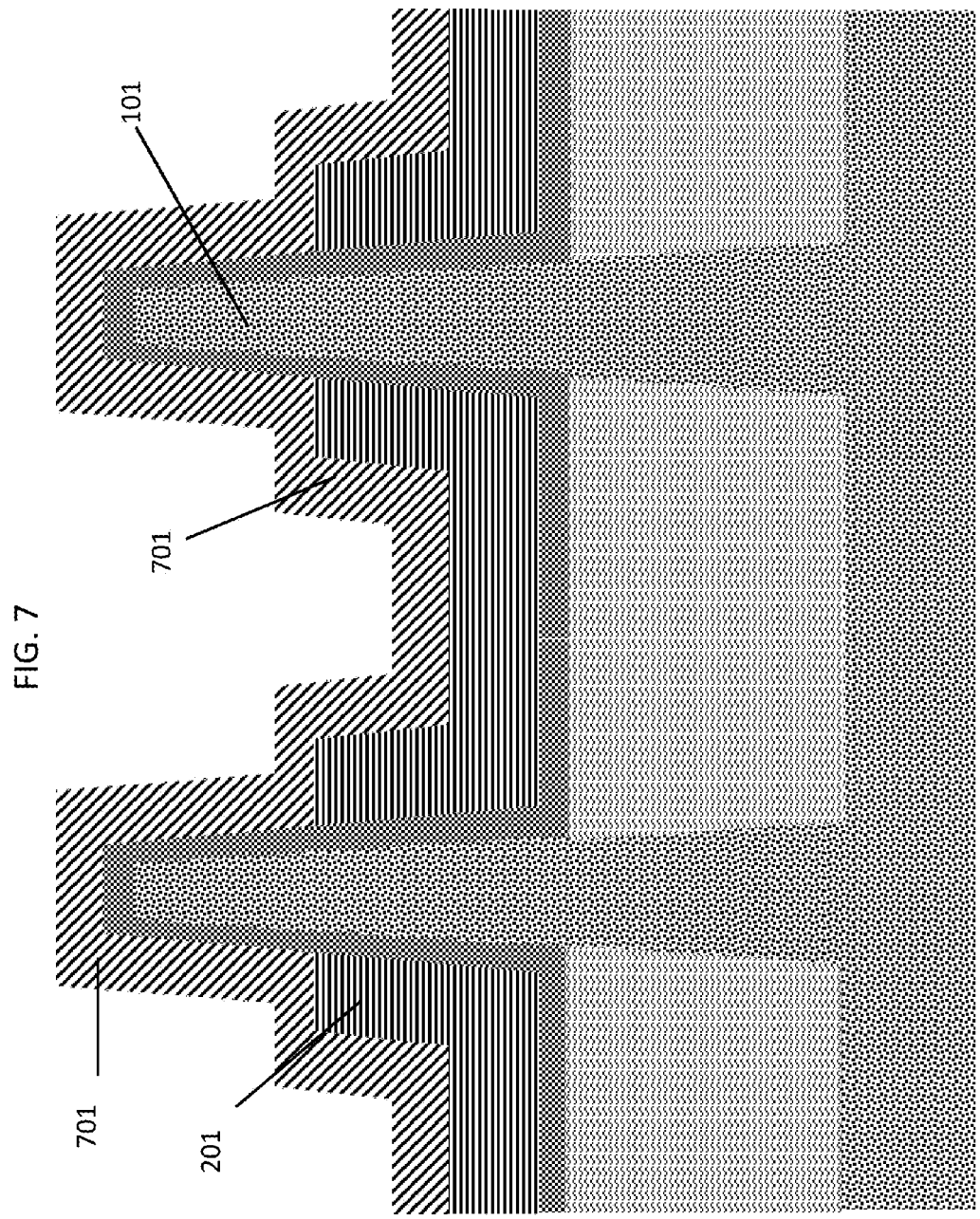

In the example of FIG. 7, a second metal 701 is deposited. In particular, the second metal 701 is formed over the first metal 201 and over the dielectric layer 105 adjacent to an upper portion of each of the fins 101. The second metal 701 can include metal compounds such as Mo, Cu, W, Ti, Ta, TiN, TaN, NiSi, CoSi, and/or other suitable conductive materials. The first metal 201 is deposited to a thickness of 0.1 to 10 nm. The second metal 701 is different than the first metal 201 and the WF of the first and second metals is different. The first metal 201 has a lower work function than the second metal 701.

Figure 8:
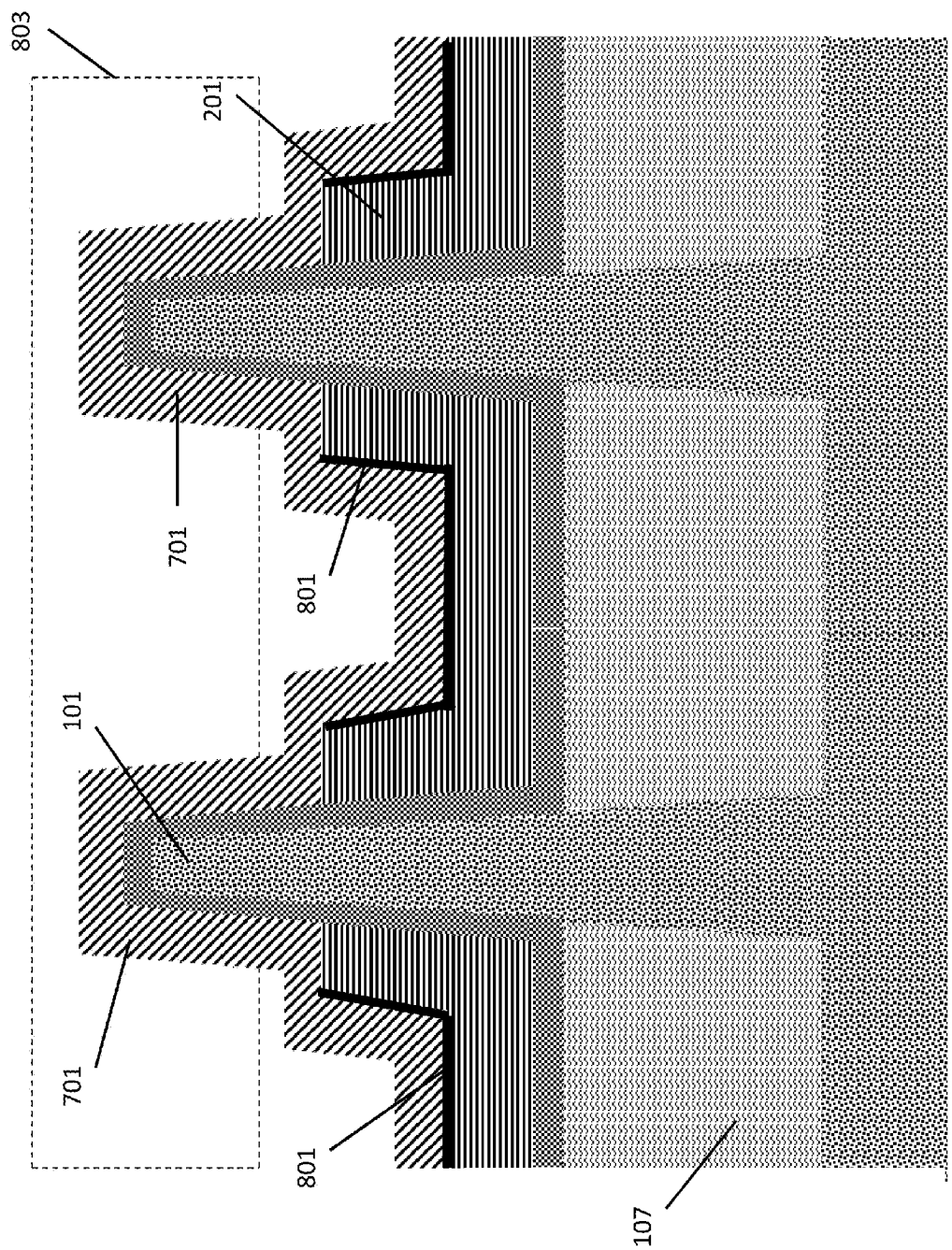

FIG. 8 illustrates an alternative process flow in which a metal cap layer 801 is formed. The metal cap layer is formed between the first metal layer 201 and second metal layer 701, adjacent to a lower portion of each of the fins 101. The metal cap layer 801 is deposited over the first metal layer 201 prior to the deposition of the isolation material 301. An upper portion of the metal cap layer 801 is removed at the same time the upper portion of the first metal layer 201 is removed to expose the upper portion of the fins 101. The portion of the metal cap layer 801 that remains is illustrated in FIG. 8. The metal cap layer 801 is deposited to a thickness of 0.1 to 5 nm and can include metal compounds such as Al, Mo, Cu, W, Ti, Ta, TiN, TaN, NiSi, CoSi, and/or other suitable conductive materials.

Additional processing may continue for the fabrication of one or more metal gates on the substrate 103. A metal gate 803 can be formed on and over the fins 101, as illustrated in FIG. 8. Following the deposition of the first metal layer 201 and second metal layer 701, a gate metal filling step is performed followed by silicide and contact formation. Silicide trench patterning and etching are performed followed by a metal deposition (e.g., nickel, tungsten) and silicide formation. Contact patterning can be performed by a double patterning process and the contact can be filled with a metal such as tungsten. Back-end-of-line (BEOL) interconnections can then be formed with additional processing.

The embodiments of the present disclosure can achieve several technical effects including a device performance boost with the finFET RMG structure which includes two WF metals on one fin. In addition, the finFET RMG structure can be used as a multi-$V_t$ scheme. By using a $V_t$ mask, such as regular threshold voltage (RVT), low threshold voltage (LVT), and super low threshold voltage (SLVT), it becomes possible to separate the metal gate for different devices. The present structure can use only two metals to realize a 3$V_t$ favor.

Devices formed in accordance with embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices having fins.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming silicon (Si) fins over a substrate;
    forming a first metal over each of the Si fins;
    forming a metal cap layer over the first metal;
    forming an isolation material over the metal cap layer and first metal;
    removing an upper portion of the isolation material to expose an upper portion of the first metal;
    removing the upper portion of the first metal to expose an upper portion of each Si fin;
    removing the isolation material after removing the upper portion of the first metal; and
    forming a second metal over the first metal and the upper portion of the Si fins,
    wherein the metal cap layer covers only a lower portion of the first metal and does not cover the upper portion of each fin.

2. The method according to claim 1, further comprising:
    forming a dielectric layer over each of the Si fins prior to forming the first metal.

3. The method according to claim 2, wherein the dielectric layer comprises a high-k dielectric.

4. The method according to claim 3, wherein the second metal is formed over the dielectric layer adjacent to an upper portion of each Si fin.

5. The method according to claim 1, further comprising:
    spin coating the isolation material over the first metal, wherein the isolation material comprises an organic planarization layer (OPL).

6. The method according to claim 1, further comprising:
    planarizing the isolation material with chemical mechanical polishing (CMP) prior to removing the upper portion of the isolation material.

7. The method according to claim 1, wherein the first metal is a punch through stop (PTS) layer.

8. The method according to claim 1, further comprising:
    removing the isolation material with wet etching.

9. The method according to claim 1, wherein the first and second metals have different work functions.

10. The method according to claim 1, wherein the first metal has a lower work function than the second metal.

11. A method comprising:
    forming silicon (Si) fins over a substrate;
    forming a high-k dielectric layer over each of the Si fins;
    forming a first metal over the high-k dielectric layer;
    forming a metal cap layer over the first metal;
    forming an organic planarization layer (OPL) over the metal cap layer and first metal;
    removing an upper portion of the OPL to expose an upper portion of the first metal;
    removing the upper portion of the first metal to expose an upper portion of each of the Si fins;
    removing the isolation material after removing the upper portion of the first metal;
    forming a second metal over the first metal and over the high-k dielectric layer adjacent to the upper portion of each of the Si fins, the second metal having a higher work function than the first metal; and
    forming a metal gate over the first and second metals,
    wherein the metal cap layer covers only a lower portion of the first metal and does not cover the upper portion of each fin.

* * * * *